(12) United States Patent
Maciejewski

(10) Patent No.: US 9,970,995 B2
(45) Date of Patent: May 15, 2018

(54) APPARATUS HAVING A FIXING DEVICE

(71) Applicant: Bernd Maciejewski, Markt Erlbach (DE)

(72) Inventor: Bernd Maciejewski, Markt Erlbach (DE)

(73) Assignee: Siemens Aktiengesellschaft, München (DE)

( * ) Notice: Subject to any disclaimer, the term of this patent is extended or adjusted under 35 U.S.C. 154(b) by 744 days.

(21) Appl. No.: 14/483,815

(22) Filed: Sep. 11, 2014

(65) Prior Publication Data

US 2015/0070017 A1     Mar. 12, 2015

(30) Foreign Application Priority Data

Sep. 11, 2013  (DE) .................. 10 2013 218 177

(51) Int. Cl.
| | | |
|---|---|---|
| *G01V 3/18* | (2006.01) | |
| *G01R 33/00* | (2006.01) | |
| *G01R 33/28* | (2006.01) | |
| *F16B 2/06* | (2006.01) | |
| *F16B 5/06* | (2006.01) | |

(52) U.S. Cl.
CPC ......... *G01R 33/0047* (2013.01); *G01R 33/28* (2013.01); *F16B 2/065* (2013.01); *F16B 5/065* (2013.01); *Y10T 403/16* (2015.01)

(58) Field of Classification Search
USPC ....................................................... 324/318
See application file for complete search history.

(56) References Cited

U.S. PATENT DOCUMENTS

| | | | |
|---|---|---|---|
| 2,189,708 A |   | 2/1940 | Coyne |
| 3,397,856 A |   | 8/1968 | Goldsmith |
| 4,983,942 A | * | 1/1991 | Benesch ............ G01R 33/3873 |
| | | | 324/318 |
| 5,237,300 A | * | 8/1993 | Ige ....................... G01R 33/421 |
| | | | 324/319 |
| 5,345,177 A | * | 9/1994 | Sato .................... G01R 33/3854 |
| | | | 324/318 |
| 5,613,667 A | * | 3/1997 | Ho ....................... B66B 11/0273 |
| | | | 248/621 |

(Continued)

FOREIGN PATENT DOCUMENTS

| | | |
|---|---|---|
| CN | 101236238 A | 8/2008 |
| CN | 203025336 U | 6/2013 |

(Continued)

OTHER PUBLICATIONS

German Office Action for German Application No. 10 2013 21 177.9, dated Jan. 21, 2015, with English Translation.

(Continued)

*Primary Examiner* — Rodney Fuller
(74) *Attorney, Agent, or Firm* — Lempia Summerfield Katz LLC

(57) ABSTRACT

An apparatus includes at least one first component, at least one second component and a fixing device that, in order to secure the at least one second component to the at least one first component, is arranged between the at least one first component and the at least one second component. The fixing device includes an adjusting unit. The adjusting unit includes at least one adjusting element for setting a fixing force.

20 Claims, 2 Drawing Sheets

(56) References Cited

U.S. PATENT DOCUMENTS

| | | | |
|---|---|---|---|
| 5,683,215 A | 11/1997 | Gaignard et al. | |
| 5,809,694 A * | 9/1998 | Postans | E05B 65/0007 |
| | | | 292/207 |
| 6,029,942 A * | 2/2000 | Daddis, Jr. | F04B 39/0044 |
| | | | 248/635 |
| 6,267,347 B1 * | 7/2001 | Ryan | F16F 1/376 |
| | | | 248/562 |
| 6,370,823 B1 * | 4/2002 | Andersen | A01K 1/0017 |
| | | | 49/57 |
| 6,437,568 B1 | 8/2002 | Edelstein et al. | |
| 6,549,010 B2 * | 4/2003 | Roozen | G01R 33/3854 |
| | | | 324/318 |
| 6,552,543 B1 * | 4/2003 | Dietz | G01R 33/3854 |
| | | | 324/318 |
| 6,609,681 B2 * | 8/2003 | Buder | B64G 1/641 |
| | | | 244/173.2 |
| 7,628,254 B1 | 12/2009 | Henderson et al. | |
| 8,842,426 B2 * | 9/2014 | Chou | G06F 1/181 |
| | | | 248/635 |
| 8,876,092 B2 * | 11/2014 | Wojcieson | F16F 15/08 |
| | | | 248/604 |
| 9,279,284 B1 * | 3/2016 | Axelrod | E06B 7/32 |
| 9,482,730 B2 * | 11/2016 | Dietz | G01R 33/28 |
| 2004/0101360 A1 * | 5/2004 | Schwartz | F16B 5/0241 |
| | | | 403/408.1 |
| 2008/0081989 A1 * | 4/2008 | Maciejewski | G01R 33/3802 |
| | | | 600/410 |
| 2008/0180102 A1 | 7/2008 | Lazar et al. | |
| 2012/0264614 A1 * | 10/2012 | Distler | G01R 33/3802 |
| | | | 505/162 |
| 2013/0234711 A1 * | 9/2013 | Dietz | G01R 33/38 |
| | | | 324/319 |
| 2013/0234712 A1 | 9/2013 | Dietz et al. | |
| 2013/0234713 A1 * | 9/2013 | Maciejewski | G01R 33/34007 |
| | | | 324/321 |
| 2017/0059677 A1 * | 3/2017 | Maciejewski | H01F 6/06 |

FOREIGN PATENT DOCUMENTS

| | | | |
|---|---|---|---|
| DE | 102008015552 | * | 11/2009 |
| DE | 102008015552 A1 | | 11/2009 |
| DE | 102010028391 A1 | | 11/2011 |
| JP | 2008125935 A | | 6/2008 |
| KR | 20020026835 A | | 4/2002 |
| KR | 20130028677 A | | 3/2013 |

OTHER PUBLICATIONS

Chinese office Action for related Chinese Application No. 201410460799.2 dated Apr. 22, 2016, with English Translation.

Korean office Action for related Korean Application No. 10-2014-0116921 dated Mar. 14, 2016 with English Translation.

* cited by examiner

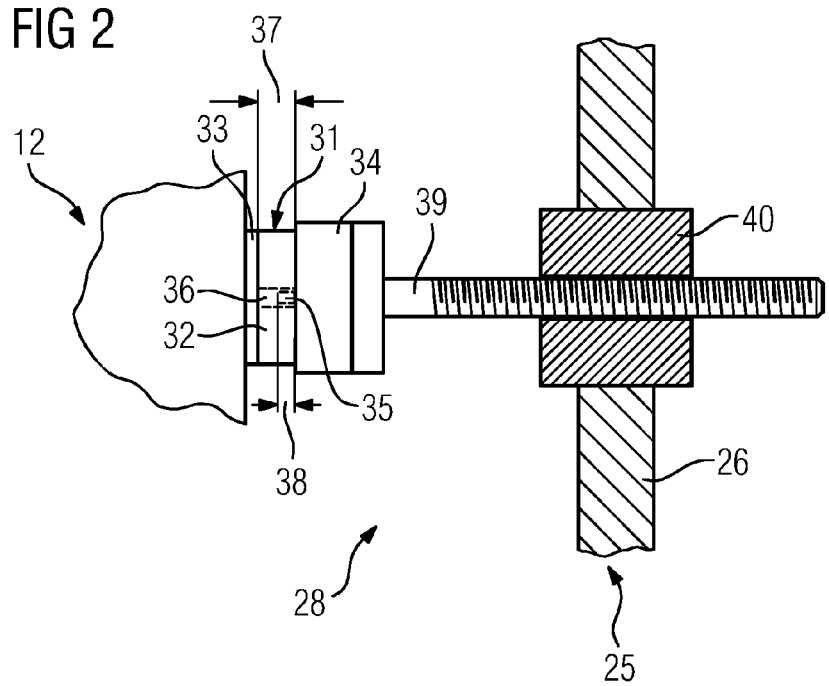
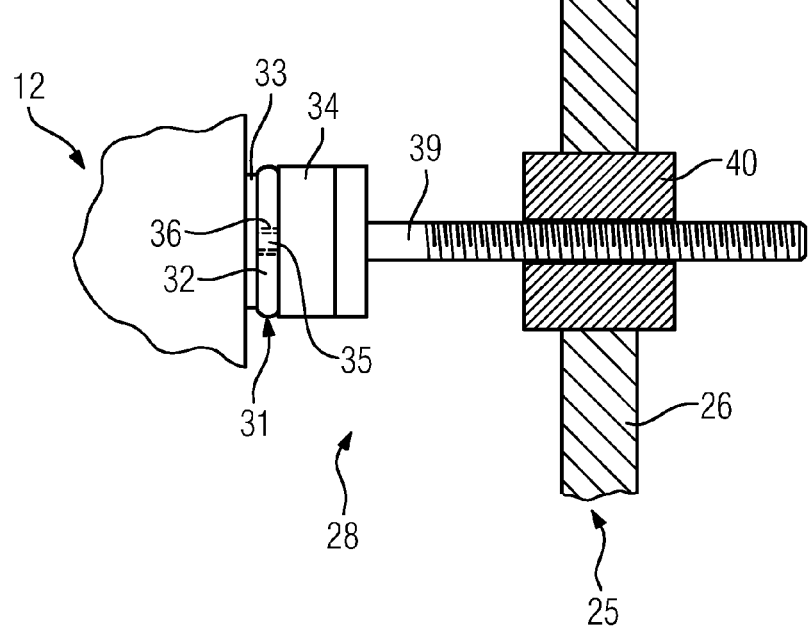

APPARATUS HAVING A FIXING DEVICE

This application claims the benefit of DE 10 2013 218 177.9, filed on Sep. 11, 2013, which is hereby incorporated by reference in its entirety.

BACKGROUND

A frequent problem that occurs when it comes to fixing two components to each other is that a maximally precise compressive force and/or a maximally precise fixing force is to be applied in order to achieve a secure positioning of the components with respect to each other.

An example of this is a vibration-damped and/or vibration-decoupled positioning of a housing unit around a magnet unit of a magnetic resonance apparatus (e.g., a medical magnetic resonance apparatus). In this case, a precise positioning of the housing unit in relation to the magnet unit is desired, which requires a precise setting of a fixing force and/or fixing position during assembly and/or installation of the housing unit.

In order to provide a precise fixing force and/or fixing position, a fixing element for securing the housing unit, for example, is to be oriented substantially orthogonally to a weight force acting on the magnet unit. However, due to manufacturing tolerances and/or tolerances in a shaping of the metal of the magnet unit (e.g., a main magnet of the magnet unit) and/or due to a welding of individual components, the fixing elements for securing the housing unit are not oriented orthogonally to the weight force of the magnet unit. To compensate for this, in order to secure the housing unit, a precise fixing force that allows a position correction is to be set. Adjusting the fixing force using a torque wrench requires a high level of assembly and/or installation effort, however. The torque wrench would have to be embodied as magnetic resonance compatible for this purpose.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a low-cost fixing device is provided in order to achieve a secure and time-saving positioning of two components with respect to each other.

One or more of the present embodiments relate to an apparatus including at least one first component, at least one second component and a fixing device that, in order to secure the at least one second component to the at least one first component, is arranged between the at least one first component and the at least one second component.

The fixing device includes an adjusting unit including at least one adjusting element for setting a fixing force. Using the adjusting unit (e.g., using the at least one adjusting element), a maximum fixing force may be set for securing the at least one second component to the at least one first component and thereby to achieve a particularly secure fixing. A particularly time-saving fixing may thus be provided, since using the at least one adjusting element, a fixing force may be indicated in a particularly simple manner to an operator (e.g., an installation technician). For example, the second component (e.g., a housing unit) may be mounted precisely to the first component (e.g., to a magnet unit of a magnetic resonance apparatus).

In one embodiment, the at least one adjusting element includes a spring element, as a result of which a particularly simple and robust adjusting element for setting a fixing force may be made available. A decoupling between the first component and the second component may be assisted by the at least partial embodiment of the at least one adjusting element as a spring element. In this case, a spring constant of the spring element may be adjusted to a maximum fixing force.

An advantageous assistance for a decoupling between the first component and the second component may be achieved if the at least one adjusting element includes a polyurethane material. An economical adjusting unit for setting a fixing force may be provided. The spring element may include the polyurethane material. The adjusting element (e.g., the spring element) includes a foamed polyurethane material. The polyurethane material (e.g., the foamed polyurethane material) forms an elastically deformable, yet dimensionally stable adjusting element that, when subjected to a load (e.g., a compressive load) is able to deform elastically, such that after the load is removed, the adjusting element assumes an original shape once more. The foamed polyurethane material may include an elastomer, and, for example, a Sylomer, so that adjusting elements having a spring constant that are particularly precisely adapted to a fixing force that is to be set may be provided. A fixing force of the elastomer (e.g., of the Sylomer) is produced based on a material-dependent spring constant in combination with a thickness of the elastomer (e.g., of the Sylomer) and a surface area with which the elastomer (e.g., the Sylomer) is in contact with the first or the second component. The fixing force is accordingly specified by a choice of material and/or a choice of a geometry for the adjusting element, with the result that a simple assembly and/or installation of the second component may be achieved with a set fixing force.

In one embodiment, the adjusting unit is arranged on the at least one first component. As a result of this, a simple fixing between the first component and the second component may be achieved. The adjusting unit may be arranged directly on the first component, such as braced directly against the first component, for example. By this, in contrast to other joining methods, such as, for example, welding and/or riveting and/or screwing, etc., a surface of the first component may be preserved unchanged, as is of advantage, for example, in the case of an embodiment of the first component as a magnet unit of a magnetic resonance apparatus (e.g., of a medical magnetic resonance apparatus). A uniform distribution of stress and/or transmission of force may also be achieved between the at least one first component and the adjusting unit.

Friction losses that may result between the first component and the adjusting element when the second component is being fixed to the first component may be prevented if the adjusting unit has at least one sliding element that is arranged between the at least one adjusting element and the at least one first component. The sliding element includes a sliding layer, such as a Teflon layer and/or a Teflon film, for example, that is arranged between the adjusting element and the first component. In this arrangement, the sliding layer is particularly advantageously adhesively bonded to a surface of the adjusting element facing toward the first component.

In a further embodiment, the fixing device includes a decoupling unit that is arranged on the adjusting unit. The adjusting unit (e.g., the at least one adjusting element) may act in a supporting function in a decoupling and/or damping of vibrations and/or oscillations between the at least one first component and the at least one second component. A compact fixing device may be achieved by the decoupling unit being directly integrated into the fixing device. In one embodiment, the decoupling unit includes at least one decoupling element that is configured for isolating and/or damping oscillations and/or vibrations between the at least one first component and the at least one second component. In this arrangement, the decoupling unit may be adhesively bonded to the adjusting unit (e.g., to the at least one adjusting element), so as to allow a uniform distribution of stress and/or transmission of force to take place between the adjusting unit and the decoupling unit. Using the adhesive bond, a connection may be achieved over a large area between the adjusting unit and the decoupling unit, which also contributes to a uniform distribution of stress and/or transmission of force between the adjusting unit and the decoupling unit. An additional damping and/or decoupling of vibrations may also be effected by an adhesive bond.

In one embodiment, the at least one adjusting element has a color that is different from a color of a component arranged on the at least one adjusting element. Via the choice of different colors for the at least one adjusting element and other components arranged on the at least one adjusting element, a user (e.g., an installation technician) may directly register a force acting on the at least one adjusting element during an assembly and/or installation operation without requiring a direct measurement scale, as would be necessary in the case of a torque wrench, for example, for this purpose. For example, the force acting on the at least one adjusting element may be registered and/or detected based on a deformation (e.g., an elastic deformation) of the at least one adjusting element. In this situation, any confusion with a further component arranged on the at least one adjusting element, with a decoupling element, for example, may advantageously be prevented.

In a development, the adjusting unit includes at least one limiting element that limits a maximum fixing force on the at least one adjusting element. In this way, a fixing force may be set in a simple and time-saving manner individually for each adjusting element of the adjusting unit. The at least one adjusting element may be protected from excessive stress. In addition, a position of the at least one second component in relation to the at least one first component may be specified by an adjustment and/or a limiting of the maximum fixing force.

A space-saving adjusting unit may advantageously be realized if the limiting element is arranged on a side of the decoupling unit facing toward the at least one adjusting element. In this arrangement, the limiting element has a length that is less than a thickness of the at least one adjusting element, such that a position of the at least one second component in relation to the at least one first component may be specified by the limiting element.

In a further embodiment, the fixing device includes at least one fixing element for fixing the at least one second component in relation to the at least one first component. The at least one fixing element is arranged on the adjusting unit and/or the decoupling unit. By this, the at least one second component may be fixed in a desired position and/or with a desired fixing force to the at least one first component. In one embodiment, the at least one fixing element includes a self-locking threaded bushing and/or other fixing elements.

If the adjusting unit is embodied as magnetic resonance compatible, the adjusting unit and consequently also the fixing device may be used for securing components inside a medical magnetic resonance apparatus.

In one embodiment, the at least one first component includes a magnet unit (e.g., a housing of a main magnet) of a magnetic resonance apparatus. In one embodiment, the at least one second component includes a housing unit (e.g., a supporting frame unit) of a magnetic resonance apparatus. With this arrangement, using the fixing device (e.g., the adjusting unit), a simple and cost-effective alignment and/or positioning of the housing unit in relation to the magnet unit during assembly and/or installation of the housing unit may be achieved. In one embodiment, the supporting frame unit of the housing unit is precisely aligned and positioned in relation to the magnet unit by the fixing device (e.g., the adjusting unit), such that a housing cover panel of the housing unit arranged on the supporting frame unit is arranged on the magnet unit. For example, this enables tolerances caused during the manufacture of the housing unit and/or of the magnet unit to be compensated for during a positioning operation with respect to the housing unit.

BRIEF DESCRIPTION OF THE DRAWINGS

FIG. 2 shows one embodiment of a fixing device with an adjusting unit in a first fixing position;
and
FIG. 3 shows one embodiment of the fixing device with the adjusting unit in a second fixing position.

DETAILED DESCRIPTION

Figure 1:
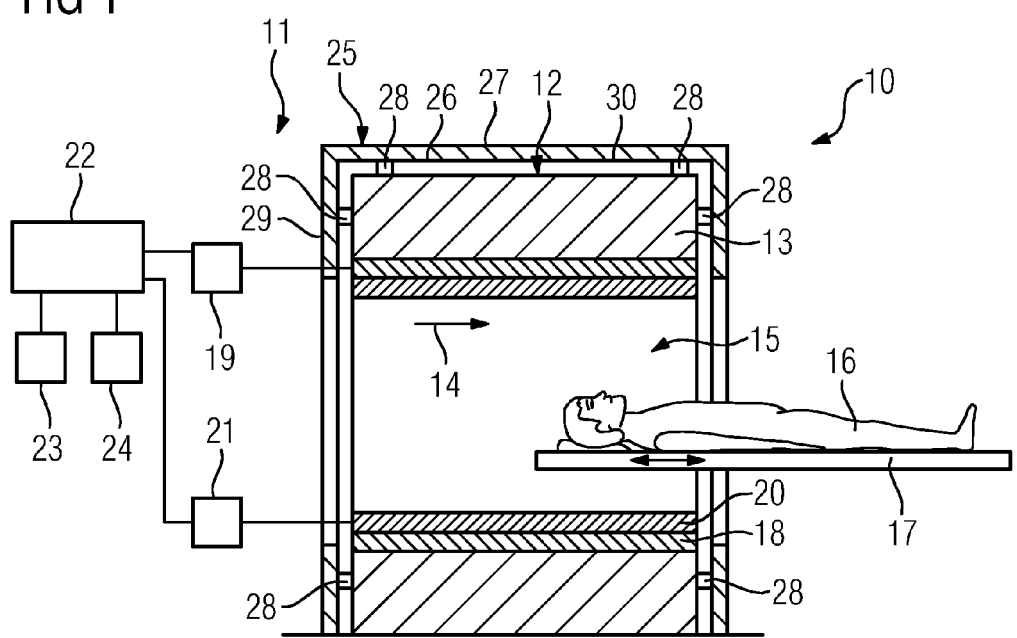
FIG. 1 shows one embodiment of a magnetic resonance apparatus.

FIG. 1 shows a schematic illustration of one embodiment of an apparatus 10 that is formed by a medical magnetic resonance apparatus 11. The embodiment of the apparatus 10 is not limited to a medical magnetic resonance apparatus 11, however. Rather, the apparatus 10 may be formed by other medical imaging devices and/or other embodiments appearing beneficial to the person skilled in the art.

The medical magnetic resonance apparatus 11 includes a magnet unit 12 having a main magnet 13 for generating a strong and, for example, constant main magnetic field 14. In addition, the medical magnetic resonance apparatus 11 has a cylinder-shaped patient receiving zone 15 for accommodating a patient 16, the patient receiving zone 15 being cylindrically surrounded by the magnet unit 13 in a circumferential direction. A different embodiment of the patient receiving zone 15 therefrom may, however, be provided. The patient 16 may be introduced into the patient receiving zone 15 using a patient positioning device 17 of the medical magnetic resonance apparatus 11. The patient positioning device 17 is movably arranged inside the patient receiving zone 15 of the medical magnetic resonance apparatus 11 for this purpose.

The magnet unit 12 also includes a gradient coil unit 18 for generating magnetic field gradients that is used for spatial encoding during imaging. The gradient coil unit 18 is controlled by a gradient control unit 19 of the medical magnetic resonance apparatus 11. The magnet unit 12 also includes a radiofrequency antenna unit 20 intended for exciting a polarization that becomes established in the main magnetic field 14 generated by the main magnet 13. The radiofrequency antenna unit 20 is controlled by a radiofrequency antenna control unit 21 of the medical magnetic resonance apparatus 11 and radiates radiofrequency magnetic resonance sequences into an examination space that is substantially formed by the patient receiving zone 15.

In order to control the main magnet 13 of the gradient coil unit 19 and in order to control the radiofrequency antenna control unit 21, the medical magnetic resonance apparatus 11 has a control unit 22 including a processor unit (not shown in further detail) and a memory unit (not shown in further detail). The control unit 22 centrally controls the medical magnetic resonance apparatus 11, such as in order to execute a predetermined imaging gradient echo sequence, for example. The control unit 22 also includes an evaluation unit for evaluating image data. Control information such as imaging parameters, for example, as well as reconstructed magnetic resonance images may be displayed on a display unit 23 (e.g., on at least one monitor) of the medical magnetic resonance apparatus 11 for an operator. The medical magnetic resonance apparatus 11 also includes an input unit 24 by which information and/or parameters may be input by an operator during a measurement procedure.

In addition, the medical magnetic resonance apparatus 11 has a housing unit 25 that shields the magnet unit 12 toward the exterior. The housing unit 25 includes a supporting frame unit 26 and a housing cover panel 27. The housing cover panel 27 is arranged on a side of the supporting frame unit 26 facing away from the magnet unit 12. In order to secure the housing unit 25 to the magnet unit 12 (e.g., to a housing (not shown in further detail) of the main magnet 13), the medical magnetic resonance apparatus 11 has a plurality of fixing devices 28 that are in each case arranged between the magnet unit 12 (e.g., the housing of the main magnet 13) and the housing unit 25 (e.g., the supporting frame unit 27). The magnet unit 12 (e.g., the housing of the main magnet 13) is formed by a first component 29, and the supporting frame unit 26 of the housing unit 25 is formed by a second component 30, between which the fixing devices 28 are arranged. The fixing devices 28 are configured as magnetic resonance compatible for the purpose of securing at least two components 29, 30 inside the medical magnetic resonance apparatus 11.

The fixing device 28 has an adjusting unit 31, one fixing device 28 in each case being arranged at a corresponding fixing point between the first component 29 and the second component 30 (e.g., between the magnet unit 13 and the supporting frame unit 26 of the housing unit 25). The fixing of the first component 29 (e.g., the housing of the magnet unit 13) to the second component 30 (e.g., the supporting frame unit 26) is illustrated in more detail below (FIGS. 2 and 3) taking a single fixing device 28 as example. The other fixing devices 28 are embodied analogously to the described fixing device 28.

The adjusting unit 31 includes in each case an adjusting element 32 that is configured for setting a fixing force in order to secure the housing of the main magnet 13 to the supporting frame unit 26 (FIGS. 2 and 3). The adjusting element 32 includes a spring element that is formed from a polyurethane material (e.g., a foamed polyurethane material), such as an elastomer, for example. In one embodiment, the adjusting element 32 includes a Sylomer (e.g., a Sylomer layer). By this, an adjusting element 32 that is embodied as elastically deformable, yet dimensionally stable, such that when subjected to a load (e.g., a compressive load), the adjusting element 32 is able to deform elastically and reassumes an original shape after the load is removed, is provided.

The adjusting unit 31 is arranged directly on the first component 29 (e.g., on the housing of the main magnet 13). In this arrangement, the supporting frame unit 27 is braced by the adjusting units 31 (e.g., by the adjusting element 32) against the housing of the main magnet 13. A supporting force and/or fixing force is generated on account of a closed frame structure of the supporting frame unit 27 around the main magnet 13 (e.g., the housing of the main magnet 13). In order to reduce friction losses that may arise when the supporting frame unit 26 is secured to the housing of the main magnet 13 by the fixing device 28, the adjusting unit 31 has a sliding element 33 that is arranged between the adjusting element 32 (e.g., the Sylomer layer) and the housing of the main magnet 13 (FIGS. 2 and 3). The sliding element 33 includes, for example, a sliding layer (e.g., a Teflon layer and/or a Teflon film) that is arranged on a side of the Sylomer layer facing toward the housing of the main magnet 13. The sliding layer 33 is adhesively bonded to the Sylomer layer. The sliding layer (e.g., the Teflon layer) completely covers the side of the adjusting element 32 (e.g., the Sylomer layer) facing toward the housing of the main magnet 13.

The fixing device 28 also includes a decoupling unit 34 including a decoupling element. The decoupling element of the decoupling unit is arranged on a side of the adjusting element 32 (e.g., the Sylomer layer) facing away from the magnet unit. In this arrangement, the decoupling element and the adjusting element 32 are adhesively bonded to each other, thereby enabling a uniform distribution of stress and/or transmission of force to take place between the adjusting unit 31 and the decoupling unit 34. In this case, the decoupling unit 34 (e.g., the decoupling element) may also include a Sylomer material. The Sylomer material of the decoupling unit 34 (e.g., of the decoupling element) is chosen such that the decoupling element has a rigidity (e.g., a spring constant) that is matched to a frequency that is to be damped and/or to vibrations that are to be isolated. In contrast, a set fixing force is essentially indicated by the Sylomer layer of the adjusting element 32. In this case, the decoupling unit 34 (e.g., the decoupling element) has a cross-sectional area that is greater than a cross-sectional area of the adjusting element. In one embodiment, the cross-sectional area of the adjusting element is smaller than the cross-sectional area of the decoupling unit 34 essentially by a half of a thickness of the adjusting element, such that an edge distance substantially corresponding to half the thickness of the adjusting element is arranged at a junction of the decoupling unit 34 with the adjusting element.

In order to prevent an overloading of the adjusting element 32 (e.g., of the Sylomer layer), the adjusting unit 31 has a limiting element 35 that limits a maximum fixing force that may act on the adjusting element 32. The limiting element 35 is embodied in the manner of a stud and/or an extension. The limiting element 35 is arranged on the side of the decoupling element facing toward the magnet unit 12. The limiting element 35 may, for example, also be embodied in a single piece and/or a single part with the decoupling unit 34 (e.g., the decoupling element of the decoupling unit 34). The adjusting element 32 (e.g., the Sylomer layer) has a recess 36 into which the limiting element 35 protrudes. A shape of the recess 36 is matched to a shape of the limiting element 35. The limiting element 35 and the recess 36 of the adjusting element are indicated by a dashed line in FIGS. 2 and 3. The limiting of the maximum fixing force is effected by a length of the limiting element 35. In this case, the limiting element 35 has a length 38 that is less than a thickness 37 of the adjusting element 32 (e.g., of the Sylomer layer) in an initial state in which no fixing force acts on the adjusting element 32 (e.g., on the Sylomer layer).

The fixing device 28 also has a fixing element 39 that is configured for securing the supporting frame unit 26 in relation to the housing of the main magnet 13. The fixing element 26 includes a threaded bolt having a bearing element that has a bearing plate (FIGS. 2 and 3). The bearing element has a cross-sectional area substantially corresponding to a cross-sectional area of the decoupling element. In addition, the fixing element 39 is arranged directly on the decoupling unit 34 and at the same time directly on the decoupling element. In this arrangement, the fixing element 39 is adhesively bonded to the decoupling element by a side of the bearing element facing away from the threaded bolt.

On account of the bracing of the adjusting unit 31 (e.g., of the adjusting element 32) against the housing of the main magnet 13, and of the adhesive bonds between the adjusting unit 31 and the decoupling unit 34 and between the decoupling unit 34 and the fixing element 39, a longitudinal extension of the threaded bolt is substantially perpendicular to a tangent at the fixing point and/or fixing zone of the housing of the main magnet 13 to the adjusting unit 31. On a side facing away from the magnet unit 12, the threaded bolt may have a bolt head by which a user may transmit a force from a tool onto the fixing element. In the exemplary embodiment, the bolt head has a hexagon socket bolt head drive.

The fixing device 28 also includes a threaded bushing 40 that is integrated into the supporting frame unit 26. In this case, the threaded bushing 40 is integrated within the supporting frame unit 26 such that the threaded bolt is guided inside the threaded bushing 40. The threaded bushing 40 is embodied as self-locking. Alternatively, the fixing device 28 may also have a further fixing element that is formed by a self-locking bolt nut or a bolt nut having a spring washer and/or other securing elements. In an alternative embodiment of the supporting frame unit 26 and the fixing device 28, a self-locking thread may be arranged incorporated directly into the supporting frame unit 26.

To provide an exact alignment of the supporting frame unit 26 in relation to the magnet unit 12 (e.g., to the housing of the main magnet 13), the supporting frame unit 26 is secured to the magnet unit 13 by a plurality of fixing devices 28 at different fixing zones and/or fixing points. In an initial state, the supporting frame unit 26 is arranged on the magnet unit 12 in a position that is not yet correct in relation thereto (e.g., in relation to the housing of the main magnet 13 (FIG. 2)). In this initial state, no fixing force acts on the adjusting element 32 (e.g., on the Sylomer layer), and the adjusting element 32 has a maximum thickness 37.

In FIG. 3, in contrast, the supporting frame unit 26 is positioned in a correct position in relation to the magnet unit 12 (e.g., in relation to the housing of the main magnet 13). In order to reach the position, the further fixing element 41 (e.g., the bolt nut) is screwed so far together with the threaded bolt until the adjusting element 32 (e.g., the Sylomer layer) has reached a minimum thickness 38. The minimum thickness 38 may be predefined by the limiting element 39 or by a spring constant of the adjusting element 32. The minimum thickness 38 of the adjusting element 32 (e.g., of the Sylomer layer) that is to be set defines the maximum fixing force. In this case, the maximum fixing force and/or the minimum thickness 38 of the adjusting element 32 (e.g., of the Sylomer layer) that is to be set are/is determined based on the thickness 32 of the adjusting element 32 (e.g., of the Sylomer layer) in the initial state, of a spring constant of the adjusting element 32 (e.g., of the Sylomer layer), and of a size of a contact surface with which the adjusting element 32 (e.g., the Sylomer layer) is in contact with the magnet unit 12.

The adjusting element 32 (e.g., the Sylomer layer) has a color that is different from a color of the decoupling element of the decoupling unit 34 and/or different from a color of the sliding element 33. Owing to the choice of different colors and/or owing to a color contrast between the adjusting element 32 and the decoupling element of the decoupling unit 34 and/or the sliding element 33, a user (e.g., an installation technician) may register directly, during an assembly and/or installation operation, a force acting on the at least one adjusting element based on a deformation (e.g., a changing thickness 38) of the adjusting element 32.

In a variation of the above-described embodiment, the adjusting unit 31 may also have more than one adjusting element 32. For example, the adjusting unit 31 may have a plurality of adjusting elements 32, such as different Sylomer layers, for example, that also have different spring constants. The different adjusting elements 32 may also have different colors so that a color contrast between the individual adjusting elements 32 is provided for an operator. A magnitude of the fixing force may also be quantitatively visualized in such a way.

In an embodiment of the adjusting unit 31 including at least two adjusting elements 32, the limiting element 35 may be arranged on one of the adjusting elements 32.

The medical magnetic resonance apparatus 11 illustrated may include further components that medical magnetic resonance devices typically have. A general mode of operation of a medical magnetic resonance apparatus is known to the person skilled in the art, so a detailed description of the general components is not provided.

Although the invention has been illustrated and described in greater detail based on the exemplary embodiments, the invention is not limited by the disclosed examples. Other variations may be derived herefrom by the person skilled in the art without leaving the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An apparatus comprising:
   a first component;
   a second component; and
   a fixing device that, in order to secure the second component to the first component, is arranged between the first component and the second component, wherein the fixing device comprises:
      an adjusting unit, the adjusting unit comprising an adjusting element for setting a fixing force;
      a vibration decoupling unit that is arranged on the adjusting unit; and
      a fixing element for fixing the second component in relation to the first component, the fixing element being arranged on the vibration decoupling unit.

2. The apparatus of claim 1, wherein the adjusting element comprises a spring element.

3. The apparatus of claim 2, wherein the adjusting element comprises a polyurethane material.

4. The apparatus of claim 3, wherein the adjusting unit is arranged on the first component.

5. The apparatus of claim 4, wherein the adjusting unit comprises a sliding element that is arranged between the adjusting element and the first component.

6. The apparatus of claim 5, wherein the fixing device has a decoupling unit that is arranged on the adjusting unit.

7. The apparatus of claim 6, wherein the adjusting element has a color that is different from a color of a component arranged on the adjusting element.

8. The apparatus of claim 7, wherein the adjusting unit comprises a limiting element that limits a maximum fixing force on the adjusting element.

9. The apparatus of claim 1, wherein the adjusting element comprises a polyurethane material.

10. The apparatus of claim 1, wherein the adjusting unit is arranged on the first component.

11. The apparatus of claim 1, wherein the adjusting unit comprises a sliding element that is arranged between the adjusting element and the first component.

12. The apparatus of claim 1, wherein the adjusting element has a color that is different from a color of a component arranged on the adjusting element.

13. The apparatus of claim 1, wherein the adjusting unit comprises a limiting element that limits a maximum fixing force on the adjusting element.

14. The apparatus of claim 13, wherein the limiting element is arranged on a side of the vibration decoupling unit facing toward the adjusting element.

15. The apparatus of claim 13, wherein the limiting element has a length that is less than a thickness of the adjusting element.

16. The apparatus of claim 1, wherein the fixing element is arranged on the adjusting unit, or the adjusting unit and the vibration decoupling unit.

17. The apparatus of claim 1, wherein the adjusting unit is configured as magnetic resonance compatible.

18. The apparatus of claim 1, wherein the first component comprises a magnet unit of a magnetic resonance apparatus.

19. The apparatus of claim 1, wherein the second component comprises a housing unit of a magnetic resonance apparatus.

20. The apparatus of claim 1, wherein the vibration decoupling unit has a cross-sectional area that is greater than a cross-sectional area of the adjusting element.

* * * * *